United States Patent
Iliasevitch

(10) Patent No.: US 6,441,645 B2
(45) Date of Patent: Aug. 27, 2002

(54) LOW VOLTAGE BIPOLAR DRIVE CIRCUITS

(75) Inventor: Stepan Iliasevitch, Nepean (CA)

(73) Assignee: Nortel Networks Limited, St. Laurent (CA)

(*) Notice: Subject to any disclaimer, the term of this patent is extended or adjusted under 35 U.S.C. 154(b) by 0 days.

(21) Appl. No.: 09/817,293

(22) Filed: Mar. 27, 2001

(30) Foreign Application Priority Data

Mar. 29, 2000 (CA) ............................................. 2302887

(51) Int. Cl.[7] .......................................... H03K 19/0175
(52) U.S. Cl. ........................................... 326/89; 326/26
(58) Field of Search ............................. 326/89, 90, 26, 326/82, 83, 86, 80; 327/538, 513

(56) References Cited

U.S. PATENT DOCUMENTS 5,883,507 A * 3/1999 Yin .............................. 323/316
5,910,749 A * 6/1999 Kimura ........................ 327/315

* cited by examiner

Primary Examiner—Don Phu Le

(57) ABSTRACT

A bipolar drive circuit comprises a differential or single-ended current mirror with signal inputs and outputs connected via resistors to a low voltage supply, e.g. 1.5 volts. A signal output voltage swing is determined and stabilized by a compensation circuit comprising a transistor having a base supplied with a reference voltage, a collector coupled via a resistor to the low voltage supply, and an emitter coupled via a resistor to ground, and a current mirror having an input coupled to the collector of the transistor and a current mirror output coupled to each signal input. A plurality of current mirror circuits can be connected in cascade, and the signal output voltage swing of each current mirror circuit can be similarly determined. The arrangement facilitates providing a drive circuit with high frequency, low supply voltage, and low power operation without transistor saturation.

20 Claims, 3 Drawing Sheets

LOW VOLTAGE BIPOLAR DRIVE CIRCUITS

This invention relates to drive circuits, and is particularly concerned with drive circuits using bipolar transistors in current mirror arrangements for operation at low supply voltages.

BACKGROUND

It is increasingly desirable to reduce the power dissipation and increase the operating bandwidth of electronic circuits. For these and other reasons, it may be desirable to use bipolar transistor technology to provide a drive circuit which operates at a low supply voltage, for example of the order of 1.5 volts, without transistor saturation which could decrease the operating bandwidth and increase current consumption and hence power dissipation of the circuit. In view of typical operating voltages of bipolar transistors, avoiding saturation presents a considerable problem with such low supply voltages, especially considering other factors such as variations of the supply voltage, variations of transistor voltages (e.g. base-emitter voltage) with temperature, and possible cascading of circuits.

An object of this invention is to provide an improved bipolar transistor drive circuit.

SUMMARY OF THE INVENTION

According to one aspect of this invention there is provided a bipolar transistor drive circuit for operation from a low voltage supply, comprising: a first current mirror circuit having an input and an output each coupled via a respective resistor to a low voltage supply and constituting respectively a signal input and a signal output of the drive circuit; and a circuit for determining an output voltage swing at the signal output, said circuit comprising a voltage reference, a compensation current mirror circuit having an input and having an output coupled to the signal input of the drive circuit, and a circuit for supplying to the input of the compensation current mirror circuit a current dependent upon the voltage reference and the supply voltage so that the signal output voltage swing is determined substantially independently of the supply voltage.

The circuit for supplying a current to the input of the compensation current mirror circuit can comprise a transistor having a base supplied with the voltage reference, a collector coupled to the input of the compensation current mirror circuit and via a resistor to the low voltage supply, and an emitter coupled via a resistor to a reference potential, for example circuit ground or 0 volts.

The drive circuit can comprise at least one further current mirror circuit connected in cascade with the first current mirror circuit, each further current mirror circuit having a signal input coupled to the signal output of the preceding current mirror circuit and an output coupled via a resistor to the low voltage supply and constituting a signal output of the respective current mirror circuit, and a respective compensation current mirror circuit having an output coupled to the signal input of the further current mirror circuit. In this case conveniently the voltage reference and the circuit for supplying a current to the input of the compensation current mirror circuit can be provided commonly for a plurality of the compensation current mirror circuits.

For handling differential signals as is often required for a drive circuit, each of the first and any further current mirror circuits can comprise a differential current mirror circuit having differential signal inputs and outputs each coupled via a respective resistor to the low voltage supply, and each compensation current mirror circuit can have two outputs coupled to the differential signal inputs of a respective one of the first and any further current mirror circuits.

The voltage reference can comprise a bandgap voltage reference source and a voltage scaling circuit for reducing a voltage provided by the bandgap voltage reference source.

The invention also provides a drive circuit comprising: a bipolar transistor differential current mirror having two differential current inputs and two differential current outputs all coupled via respective resistors to a low voltage supply, the differential inputs and outputs constituting differential signal inputs and outputs respectively of the drive circuit; a circuit comprising a bipolar transistor having a base supplied with a reference voltage, a collector coupled via a resistor to the low voltage supply, and an emitter coupled via a resistor to a reference potential; and a bipolar transistor current mirror having a current input coupled to the collector of said bipolar transistor and two current mirror outputs coupled to the differential signal inputs, said circuit and bipolar transistor current mirror serving to stabilize a signal voltage swing at the differential signal outputs.

The invention further provides a drive circuit comprising: a bipolar transistor current mirror having a current input and a current output each coupled via a respective resistor to a low voltage supply, the input and output constituting a signal input and output respectively of the drive circuit; a circuit comprising a bipolar transistor having a base supplied with a reference voltage, a collector coupled via a resistor to the low voltage supply, and an emitter coupled via a resistor to a reference potential; and a bipolar transistor current mirror having a current input coupled to the collector of said bipolar transistor and a current mirror output coupled to the signal input, said circuit and bipolar transistor current mirror serving to stabilize a signal voltage swing at the signal output.

In addition, the invention provides a drive circuit comprising: a first current mirror circuit comprising first and second bipolar transistors having emitters coupled to a reference potential, bases coupled together and to the collector of the first transistor, and collectors of the first and second transistors constituting a signal input and a signal output respectively and being coupled via respective resistors to a low voltage supply; a source of a reference voltage; a third bipolar transistor having a base supplied with the reference voltage, a collector coupled via a resistor to the low voltage supply, and an emitter coupled via a resistor to a reference potential; and a compensation current mirror circuit comprising fourth and fifth bipolar transistors having emitters coupled to a reference potential, bases coupled together and to the collector of the fourth transistor, and collectors of the fourth and fifth transistors coupled to the collectors of the third and first transistors respectively.

Another aspect of the invention provides a method of determining and stabilizing a signal voltage swing at an output of a current mirror circuit, comprising the step of reducing current at a signal input of the current mirror circuit, in dependence upon a reference voltage and a supply voltage of the current mirror circuit, using a compensation current mirror circuit, so that the output signal voltage swing is not dependent upon the supply voltage.

In this method the current mirror circuit and the compensation current mirror circuit can comprise bipolar transistors, and the supply voltage can be of the order of 1.5 volts. The method can be applied to each of a plurality of current mirror circuits connected in cascade. In addition, the current mirror circuits can comprise differential current mirror circuits having differential signal inputs and outputs.

BRIEF DESCRIPTION OF THE DRAWINGS

The invention will be further understood from the following description by way of example with reference to the accompanying drawings, in which.

DETAILED DESCRIPTION

The following description omits the words "bipolar transistor" for brevity and clarity, but it is to be understood that the embodiments of the inventive drive circuit and the circuits described herein relate to technologies using bipolar transistors, as distinct for example from CMOS (complementary metal-oxide-semiconductor) technology.

Figure 1:
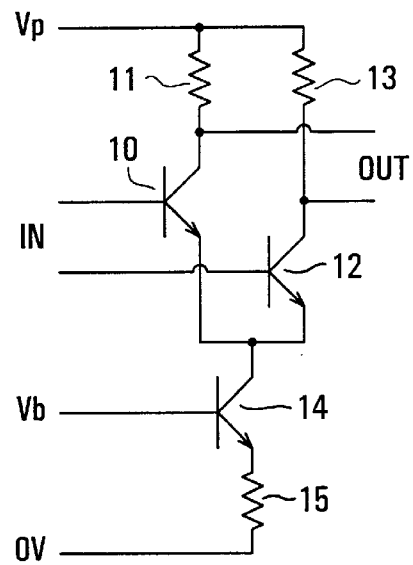
FIG. 1 schematically illustrates a known low voltage bipolar transistor drive circuit.

Referring to the drawings, FIG. 1 illustrates a known low voltage drive circuit for a differential signal, comprising a differential amplifier including NPN transistors 10 and 12 in a long-tailed pair configuration, with their collectors connected via respective resistors 11 and 13 to a positive supply voltage Vp, and with their emitters connected together and via the collector-emitter path of an NPN transistor 14 and a resistor 15 to ground (0 volts, abbreviated to 0 V). A bias voltage Vb is supplied to the base of the transistor 14, a differential binary input signal is supplied to the bases of the transistors 10 and 12, and a differential digital output signal is derived from the collectors of the transistors 10 and 12. For example, with a nominal supply voltage of 1.5 volts, each output connection may be desired to change between substantially this voltage Vp=1.5 V and a lower voltage of 1 volt, i.e. to have an output voltage swing of 0.5 V.

Typically in such a circuit the bias voltage Vb is selected for a desired base-emitter voltage (Vbe) of the transistor 14 plus a desired voltage drop across the resistor 15, whose resistance R15 (for convenience and clarity, throughout this description the resistance of a resistor is represented by the letter R followed by the drawing reference numeral of the resistor) is selected to provided a desired low current for the differential transistors 10 and 12. The desired voltage drop across the resistor 15 may for example be 0.15 V.

A significant problem with such a circuit is that the supply voltage Vp may vary, for example by ±10% so that it can be as low as 1.35 V, and the transistor Vbe can vary for example between 0.75 V and 0.9 V, so that under worst case conditions of minimum supply voltage and maximum Vbe there is a very low voltage for biasing the transistor 14. Consequently, this leads to operation at levels very close to transistor saturation, which is undesirable for high frequency and low current operation, and makes the circuit susceptible to noise. Operation of such a circuit at an even lower supply voltage, for example with a supply voltage of 1.3 V as may be desired, is substantially impractical.

Accordingly, it is desirable to provide a different form of drive circuit, for which reason embodiments of the invention as described below make use of current mirror (CM) circuits. One known CM circuit is illustrated in FIG. 2.

Figure 2:
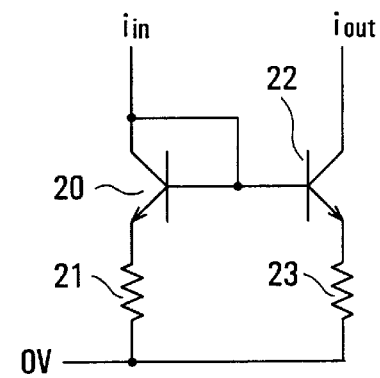
FIG. 2 schematically illustrates a known bipolar transistor current mirror circuit.

Referring to FIG. 2, two NPN transistors 20 and 22 have their bases connected together and their emitters connected via respective resistors 21 and 23 to ground (0 V). The transistor 20 is diode-connected by a connection between its collector and base. An input current $i_{in}$ supplied to the interconnected collector and base of the transistor 20 is mirrored by the transistor 22 to produce in its collector circuit an output current $i_{out}$, with a gain m which is determined by area ratios of the transistors 20 and 22 and resistances of the resistors 21 and 23. The collectors of the transistors can be connected via respective resistors (not shown in FIG. 2) to a positive supply voltage (not shown in FIG. 2). As is known in the art, the emitter resistors 21 and 23 can optionally be omitted.

Figure 3:
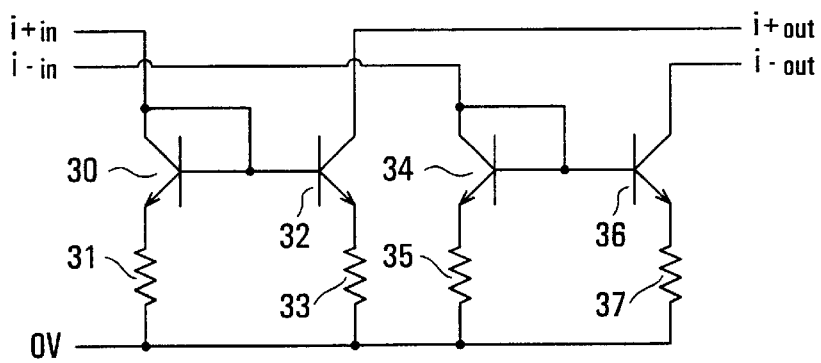
FIG. 3 schematically illustrates a known bipolar transistor differential current mirror circuit.

The CM circuit of FIG. 2 is single-ended, and can be substantially duplicated to provide a known differential current mirror (DCM) circuit as shown in FIG. 3. Thus the DCM circuit of FIG. 3 comprises NPN transistors 30, 32, 34, and 36 and respective emitter resistors 31, 33, 35, and 37 connected to ground (0 V); the resistors can optionally be omitted. The transistors 30 and 34 are each diode-connected and have their bases connected to the bases of the transistors 32 and 36 respectively, so that differential input currents $i+_{in}$ and $i-_{in}$ supplied to the transistors 30 and 34 are mirrored to produce differential output currents $i+_{out}$ and $i-_{out}$ in the collector circuits of the transistors 32 and 36 respectively. The DCM circuit can provide a gain m so that nominally the equation $(i+_{out}-i-_{out})=m(i+_{in}-i-_{in})$ is satisfied.

It is desirable that this equation be met precisely, i.e. that there be no differential current offset, but typically with the DCM circuit of FIG. 3 there is also a differential current offset so that this equation is not precisely met. Another DCM circuit, in which the differential current offset is reduced or eliminated, is illustrated in FIG. 4.

Figure 4:
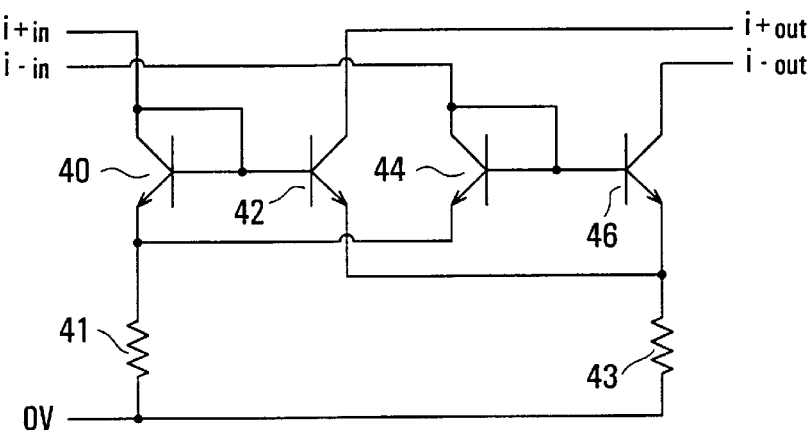
FIG. 4 schematically illustrates another bipolar transistor differential current mirror circuit.

Referring to FIG. 4, the DCM circuit illustrated therein comprises NPN transistors 40, 42, 44, and 46, the transistors 40 and 44 each being diode-connected with their bases connected to the bases of the transistors 42 and 46 respectively, differential input currents $i+_{in}$ and $i-_{in}$ supplied to the transistors 40 and 44 being mirrored to produce differential output currents $i+_{out}$ and $i-_{out}$ in the collector circuits of the transistors 42 and 46 respectively. The DCM circuit of FIG. 4 differs from that of FIG. 3 in that the emitters of the input transistors 40 and 44 are connected together and via a resistor 41 to ground (0 V), and the emitters of the output transistors 42 and 46 are connected together and via a resistor 43 to ground (0 V). The resistors 41 and 43 can alternatively be replaced by constant current circuits. As indicated above, the DCM circuit of FIG. 4 more precisely satisfies the equation $(i+_{out}-i-_{out})=m(i+_{in}-i-_{in})$, where m is the current mirror gain.

Figure 5:
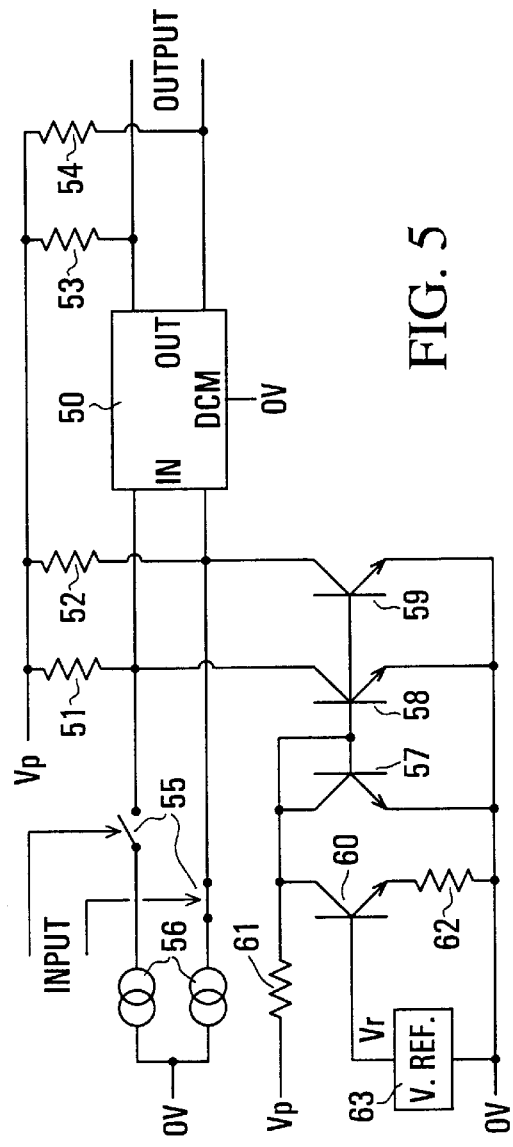
FIG. 5 schematically illustrates a low voltage bipolar transistor drive circuit in accordance with an embodiment of this invention.

FIG. 5 illustrates a low voltage drive circuit, in accordance with an embodiment of this invention, which includes a DCM circuit 50 which can have the form of FIG. 3 but preferably has the form of FIG. 4. As illustrated in FIG. 5, the DCM circuit 50 has a two-wire input IN for the differential input currents $i+_{in}$ and $i-_{in}$, these two wires being connected via respective resistors 51 and 52 to a positive supply voltage Vp. The DCM circuit 50 also has a two-wire output OUT for the output currents i+$_{out}$ and i−$_{out}$, these two wires being connected via respective resistors 53 and 54 to the positive supply voltage Vp. For example Vp=1.5 volts. The DCM circuit 50 provides a current gain m between its input and its output; for low power operation with very high frequency digital signals, up to about 5 GHz, for example m may be of the order of 4 to 10. The resistances of the resistors 51 and 52 are equal, i.e. R51=R52, and the resistances of the resistors 53 and 54 are equal, i.e. R53=R54.

The two-wire input IN of the DCM circuit 50 is supplied with a differential input signal which for illustrative purposes is shown in FIG. 5 as being provided by a circuit comprising two switches 55, controlled in a complementary manner from a differential input, each for coupling a respective one of two current sources 56 to a respective one of the resistors 51 and 52 to supply a current thereto when the switch is closed. Any other desired form of input circuit can instead be provided for supplying currents differentially to the resistors 51 and 52, and the particular circuit illustrated is given only by way of example. Furthermore, in a cascade arrangement of several DCM circuits as further described below the output of one DCM circuit can directly constitute the input for the next DCM circuit in the cascade. Thus there can be only one DCM circuit or, especially when DCM circuits of the form illustrated in FIG. 4 are used, there can be several series-connected DCM circuits. The two-wire output of the DCM circuit 50, providing the differential output currents i+$_{out}$ and i−$_{out}$ which flow via the resistors 53 and 54 respectively, constitute a differential output of the drive circuit of FIG. 5.

The drive circuit of FIG. 5 also includes a compensation circuit comprising four NPN transistors 57 to 60, two resistors 61 and 62, and a voltage reference source 63 which provides a reference voltage Vr to the base of the transistor 60. The transistor 60 has its collector coupled via the resistor 61 to the positive supply voltage Vp and its emitter coupled to ground (0 V) via the resistor 62. The collector of the transistor 60 is also connected to the collector and base of the transistor 57 which is thereby diode-connected, and to the bases of the transistors 58 and 59. The emitters of the transistors 57 to 59 are connected to ground (0 V), so that these transistors constitute a current mirror with a gain m$_c$ from the transistor 57 to each of the transistors 58 and 59. The collectors of the transistors 58 and 59 are connected respectively to the resistors 51 and 52, and hence to the two-wire input IN of the DCM circuit 50. Emitter resistors, not shown, may optionally be included between the emitters of the transistors 57 to 59 and ground (0 V).

In operation of the drive circuit of FIG. 5, the complementary switches 55 are controlled by the input signal so that the resistors 51 and 52 conduct current alternately, whereby the input transistors 40 and 44 (FIG. 4, or 30 and 34, FIG. 3) of the DCM circuit 50 also conduct alternately, their currents being mirrored with the gain m by the output transistors 42 and 46 (FIG. 4, or 32 and 36, FIG. 3). The output transistor currents flow via the resistors 53 and 54 to provide across these resistors an output voltage swing having a desired amplitude, for example 0.5 V as described above.

The compensation circuit serves to determine and stabilize this output voltage swing in the manner described below. In the following description, it is assumed for simplicity that the DCM circuit 50 has the form of FIG. 4 with the resistors 41 and 43 having zero resistance or being omitted; this is the same as the form of FIG. 3 with its emitter resistors omitted. A similar result can be derived in either case when the respective resistors are present. Although the following description relates to only one half of the DCM circuit 50 and the corresponding resistors and parts of the compensation circuit, it can be appreciated that the same comments apply for the other half.

The reference voltage Vr supplied by the source 63 is selected to be equal to a reference voltage Vref plus one Vbe, i.e. the base-emitter voltage of one transistor. The reference voltage Vref is desirably derived from a precise temperature-stable bandgap voltage reference as described later below. Consequently, the emitter voltage of the transistor 60 is equal to Vref, and this transistor 60 conducts a current i$_{60}$ equal to Vref/R62, where as indicated above R62 is the resistance of the resistor 62. The resistor 61 drops a voltage equal to Vp−Vbe$_{57}$ where Vbe$_{57}$ is the base-emitter voltage of the transistor 57. Consequently, the transistor 57 conducts a current i$_{57}$ given by:

$$i_{57}=(Vp-Vbe_{57})/R61-Vref/R62.$$

This current is mirrored by the transistor 58 with the gain m$_c$ to produce a proportional current i$_{58}$=m$_c$i$_{57}$ conducted by the transistor 58. With the states of the switches 55 as shown in FIG. 5, the resistor 51 drops a voltage Vp−Vbe$_{in}$ where Vbe$_{in}$ is the base-emitter voltage of the input transistor 40 of the DCM circuit 50, and this transistor 40 consequently conducts a current i$_{in}$ given by:

$$i_{in}=(Vp-Vbe_{in})/R51-m_c i_{57}.$$

This current is mirrored by the transistor 42 with the gain m to produce a proportional output current i$_{out}$=mi$_{in}$ which flows via the resistor 53, producing a voltage drop V$_{R4}$ equal to mR53i$_{in}$ which constitutes the output voltage swing of the drive circuit. Combining these equations gives:

$$V_{R4}=m(R53/R51)\{Vp-Vbe_{in}-m_c(R51/R61)(Vp-Vbe_{57}-(R61/R62)Vref)\},$$

from which it can be seen that if the values m$_c$, R51, and R61 are selected so that m$_c$(R51/R61)=1, and if Vbe$_{in}$=Vbe$_{57}$, then:

$$V_{R4}=m(R53/R51)(R61/R62)Vref.$$

Thus it can be seen that the output voltage swing is dependent only upon the gain m of the DCM circuit 50, resistance ratios of the resistors 51, 53, 61, and 62, all of which are fixed and predetermined, and the reference voltage Vref which is also fixed, predetermined, and temperature-stable. Consequently, the output voltage swing is stable, as is desired.

Figure 6:
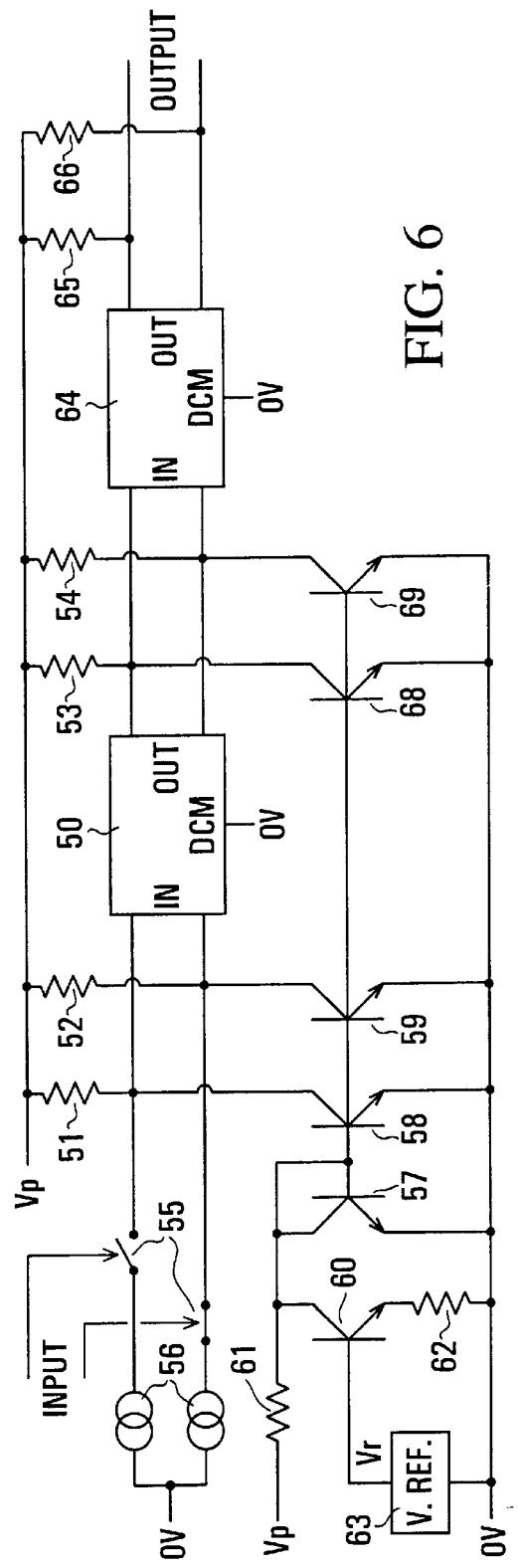
FIG. 6 schematically illustrates a low voltage bipolar transistor drive circuit in accordance with another embodiment of the invention.

As indicated above, the DCM circuit 50 in the drive circuit of FIG. 5 may provide only a relatively small current gain m, whereas a considerably larger current gain may be desired. Such a larger current gain can be provided by connecting two or more similar drive circuit stages in cascade, as illustrated in FIG. 6 and as described below. In such a cascade of drive circuits, some or all of the components 57 and 60–63 of the circuit of FIG. 5 can be used commonly for a plurality of stages, and between successive stages a single pair of resistors can constitute both the output resistors (53 and 54 as shown in FIG. 4) of the preceding DCM circuit and the input resistors (51 and 52 in FIG. 4) of the following DCM circuit.

FIG. 6 illustrates a drive circuit comprising a cascade of two current gain stages, a first one of which is the same as described above with reference to FIG. 5 and uses the same reference numerals. The drive circuit of FIG. 6 further comprises a DCM circuit 64, resistors 65 and 66, and NPN transistors 68 and 69. The DCM circuit 64 has a two-wire input IN which is connected to the two-wire output OUT of the DCM circuit 50 and hence also to the resistors 53 and 54, and a two-wire output OUT for its output currents, these two wires being connected via the respective resistors 65 and 66 to the positive supply voltage Vp, and constituting a differential output of the drive circuit. The transistors 68 and 69 have their collectors connected respectively to the two wires of the input of the DCM circuit 64, their emitters connected to ground (0 V), and their bases connected to the base of the transistor 57 to form a second current mirror pair with that transistor. Emitter resistors, not shown, may optionally be included between the emitters of the transistors 57 to 59, 68, and 69 and ground (0 V).

Thus the arrangement of the input-side resistors 53 and 54, current mirror transistors 68 and 69, and output-side resistors 65 and 66 with respect to the DCM circuit 64 is the same as the arrangement of the input-side resistors 51 and 52, current mirror transistors 58 and 59, and output-side resistors 53 and 54 respectively with respect to the DCM circuit 50. The current mirror comprising the transistors 57, 68, and 69 can provide a respective gain $m_{c1}$ to provide compensation for the DCM circuit 64 in the same manner as described above by selecting values so that $m_{c1}(R53/R61)=1$, and if the DCM circuit 64 provides a gain $m_1$ then its output voltage swing, equal to $m_1(R65/R53)(R61/R62)$Vref, is also stable. The overall gain of the cascaded drive circuit of FIG. 6 is the product of the gains m and $m_1$ of the DCM circuits 50 and 64 respectively.

It can be appreciated that such cascading can be applied to a larger number of stages in a similar manner. It can also be appreciated that alternatively different reference voltage sources and current mirror compensation circuits can be provided for different ones of the stages. The same comments apply to single-ended current mirror stages as further described below.

Figure 7:
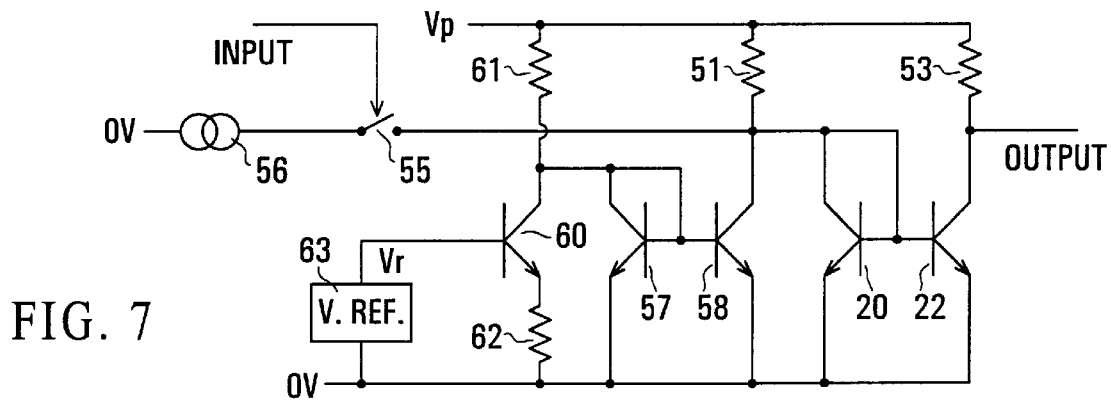
FIG. 7 schematically illustrates a low voltage bipolar transistor drive circuit in accordance with a further embodiment of the invention.

Although the drive circuits of FIGS. 5 and 6 use differential current mirrors for handling differential signals, the invention is equally applicable to single-ended drive circuits, an example of which is illustrated in FIG. 7. The drive circuit of FIG. 7 is similar to that of FIG. 5 and accordingly uses the same reference numerals where applicable, except that it is arranged for a single-ended signal and accordingly one of the switches 55 and current sources 56 of the example input circuit are omitted, the compensation circuit transistor 59 and the resistors 52 and 54 are omitted, and the DCM circuit 50 of FIG. 5 is replaced by a CM circuit of the form shown in FIG. 2, comprising the transistors 20 and 22, in this case the resistors 21 and 23 also being omitted. The operation of the drive circuit of FIG. 7, and the manner in which a stable output voltage swing is provided, is substantially the same as described above with reference to FIG. 5, and it will be appreciated that such a single-ended arrangement can also use a cascade of CM circuits in a similar manner to that described above with reference to FIG. 6.

Figure 8:
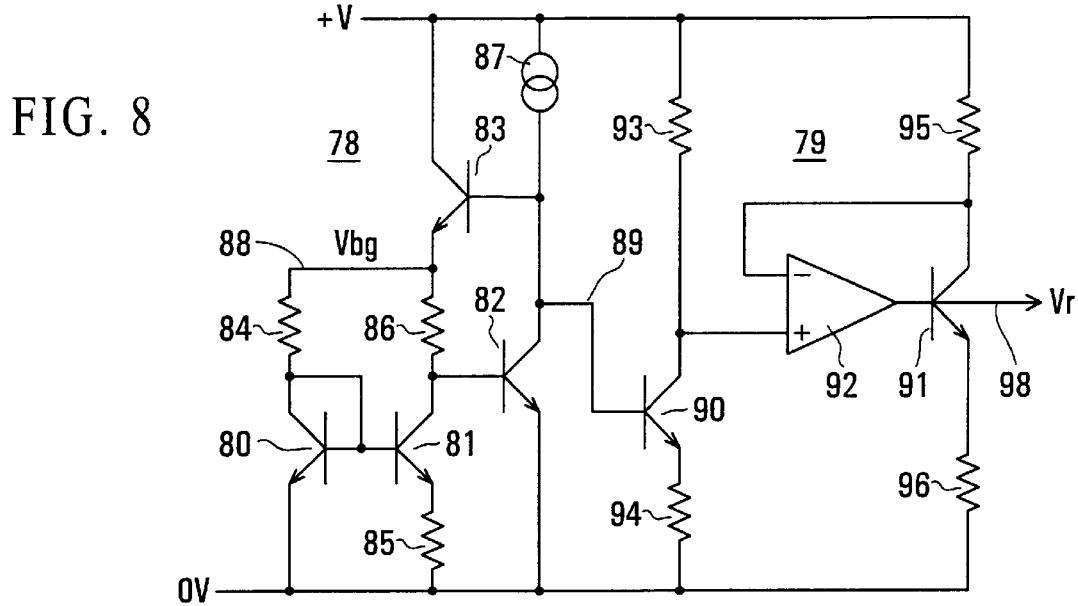
FIG. 8 schematically illustrates a bipolar transistor voltage reference circuit which may be used in the circuit of FIG. 5, 6, or 7.

FIG. 8 illustrates one form of circuit which may be used to constitute the voltage reference source 63. The circuit comprises a voltage source circuit 78 and a voltage scaling circuit 79.

The voltage source circuit 78 comprises NPN transistors 80 to 83, resistors 84 to 86, and a current source 87. The transistor 80 has its emitter connected to ground (0 V) and its collector connected to its base and via the resistor 84 to a line 88 on which the circuit produces a temperature-stable so-called bandgap reference voltage Vbg. The transistor 81 has its emitter connected via the resistor 85 to ground (0 V), and its base connected to the base of the transistor 80, the transistor 81 being sized relative to the transistor 80 to provide different current densities through the transistors 80 and 81. The collector of the transistor 81 is connected via the resistor 86 to the line 88. The transistor 82 has its base connected to the collector of the transistor 81, its emitter connected to ground (0 V), and its collector connected via the current source 87 to a positive voltage +V which typically may be higher than the voltage Vp. The transistor 83 has its collector connected to the voltage +V, its emitter connected to the line 88, and its base connected to the collector of the transistor 82. A voltage reference output line 89 of the circuit 78 is also connected to the collector of the transistor 82, providing a reference voltage equal to the voltage Vbg on the line 88 plus the base-emitter voltage Vbe of the transistor 83.

As the voltage on the line 89 is typically higher than is desired for the voltage Vr required for operation of the drive circuit as described above with its low supply voltage Vp, this voltage on the line 89 is scaled by the scaling circuit 79. The circuit 79 comprises NPN transistors 90 and 91, a differential amplifier 92, and resistors 93 to 96. The transistor 90 has its base connected to the line 89, its emitter connected via the resistor 94 to ground (0 V), and its collector connected via the resistor 93 to the voltage +V. The transistor 91 has its emitter connected via the resistor 96 to ground (0 V) and its collector connected via the resistor 95 to the voltage +V. The differential amplifier 92 has a non-inverting input (+) connected to the collector of the transistor 90, an inverting input (−) connected to the collector of the transistor 91, and an output connected to the base of the transistor 91 and to an output line 98 providing the reference voltage Vr.

It can be appreciated from the above description and the circuit of FIG. 8 that the emitter of the transistor 90 is at the voltage Vbg, and that the differential amplifier 92 maintains the circuit so that the emitter of the transistor 91 is at a proportional voltage kvbg, where k is a scaling constant (typically less than one) equal to (R96/R95)(R93/R94), where R93 to R96 are the resistances of the resistors 93 to 96 respectively. The output voltage of the differential amplifier 92 is at this scaled voltage kvbg plus the base-emitter voltage Vbe of the transistor 91, this constituting the desired reference voltage Vr.

It can be appreciated that the desired reference voltage Vr can be produced in any other desired manner.

The drive circuits described above provide advantages in that they operate at a low supply voltage and with a low power in an efficient manner to provide outputs with stable and predetermined voltage swings, thereby avoiding transistor saturation especially when several of the drive circuits are connected in cascade. Consequently, the drive circuits can operate with very high signal frequencies, for example up to about 5 GHz.

Although particular embodiments of the invention have been described above, it can be appreciated that numerous modifications, variations, and adaptations may be made without departing from the scope of the invention as defined in the claims.

What is claimed is:

1. A bipolar transistor drive circuit for operation from a low voltage supply, comprising:
   a first current mirror circuit having an input and an output each coupled via a respective resistor to a low voltage supply and constituting respectively a signal input and a signal output of the drive circuit; and a circuit for determining an output voltage swing at the signal output, said circuit comprising a voltage reference, a compensation current mirror circuit having an input and having an output coupled to the signal input of the drive circuit, and a circuit for supplying to the input of the compensation current mirror circuit a current dependent upon the voltage reference and the supply voltage so that the signal output voltage swing is determined substantially independently of the supply voltage.

2. A drive circuit as claimed in claim 1 wherein the circuit for supplying a current to the input of the compensation current mirror circuit comprises a transistor having a base supplied with the voltage reference, a collector coupled to the input of the compensation current mirror circuit and via a resistor to the low voltage supply, and an emitter coupled via a resistor to a reference potential.

3. A drive circuit as claimed in claim 1 and comprising at least one further current mirror circuit connected in cascade with the first current mirror circuit, each further current mirror circuit having a signal input coupled to the signal output of the preceding current mirror circuit and an output coupled via a resistor to the low voltage supply and constituting a signal output of the respective current mirror circuit, and a respective compensation current mirror circuit having an output coupled to the signal input of the further current mirror circuit.

4. A drive circuit as claimed in claim 3 wherein the voltage reference and the circuit for supplying a current to the input of the compensation current mirror circuit are provided commonly for a plurality of the compensation current mirror circuits.

5. A drive circuit as claimed in claim 1 wherein the first current mirror circuit comprises a differential current mirror circuit having differential signal inputs and outputs each coupled via a respective resistor to the low voltage supply, and the compensation current mirror circuit has two outputs coupled to the differential signal inputs of the first current mirror circuit.

6. A drive circuit as claimed in claim 2 wherein the first current mirror circuit comprises a differential current mirror circuit having differential signal inputs and outputs each coupled via a respective resistor to the low voltage supply, and the compensation current mirror circuit has two outputs coupled to the differential signal inputs of the first current mirror circuit.

7. A drive circuit as claimed in claim 3 wherein each of the first and further current mirror circuits comprises a differential current mirror circuit having differential signal inputs and outputs each coupled via a respective resistor to the low voltage supply, and each compensation current mirror circuit has two outputs coupled to the differential signal inputs of a respective one of the first and further current mirror circuits.

8. A drive circuit as claimed in claim 1 wherein the low voltage supply comprises a supply voltage of the order of 1.5 volts.

9. A drive circuit as claimed in claim 1 wherein the voltage reference comprises a bandgap voltage reference source and a voltage scaling circuit for reducing a voltage provided by the bandgap voltage reference source.

10. A drive circuit comprising:

a bipolar transistor differential current mirror having two differential current inputs and two differential current outputs all coupled via respective resistors to a low voltage supply, the differential inputs and outputs constituting differential signal inputs and outputs respectively of the drive circuit;

a circuit comprising a bipolar transistor having a base supplied with a reference voltage, a collector coupled via a resistor to the low voltage supply, and an emitter coupled via a resistor to a reference potential; and a bipolar transistor current mirror having a current input coupled to the collector of said bipolar transistor and two current mirror outputs coupled to the differential signal inputs, said circuit and bipolar transistor current mirror serving to stabilize a signal voltage swing at the differential signal outputs.

11. A drive circuit comprising:

a bipolar transistor current mirror having a current input and a current output each coupled via a respective resistor to a low voltage supply, the input and output constituting a signal input and output respectively of the drive circuit;

a circuit comprising a bipolar transistor having a base supplied with a reference voltage, a collector coupled via a resistor to the low voltage supply, and an emitter coupled via a resistor to a reference potential; and a bipolar transistor current mirror having a current input coupled to the collector of said bipolar transistor and a current mirror output coupled to the signal input, said circuit and bipolar transistor current mirror serving to stabilize a signal voltage swing at the signal output.

12. A drive circuit comprising:

a first current mirror circuit comprising first and second bipolar transistors having emitters coupled to a reference potential, bases coupled together and to the collector of the first transistor, and collectors of the first and second transistors constituting a signal input and a signal output respectively and being coupled via respective resistors to a low voltage supply;

a source of a reference voltage;

a third bipolar transistor having a base supplied with the reference voltage, a collector coupled via a resistor to the low voltage supply, and an emitter coupled via a resistor to a reference potential; and a compensation current mirror circuit comprising fourth and fifth bipolar transistors having emitters coupled to a reference potential, bases coupled together and to the collector of the fourth transistor, and collectors of the fourth and fifth transistors coupled to the collectors of the third and first transistors respectively.

13. A method of determining and stabilizing a signal voltage swing at an output of a current mirror circuit, comprising the step of reducing current at a signal input of the current mirror circuit, in dependence upon a reference voltage and a supply voltage of the current mirror circuit, using a compensation current mirror circuit, so that the output signal voltage swing is not dependent upon the supply voltage.

14. A method as claimed in claim 13 wherein the current mirror circuit and the compensation current mirror circuit comprise bipolar transistors.

15. A method as claimed in claim 13 wherein the supply voltage is of the order of 1.5 volts.

16. A method as claimed in claim 13 and applied to each of a plurality of current mirror circuits connected in cascade.

17. A method as claimed in claim 14 and applied to each of a plurality of current mirror circuits connected in cascade.

18. A method as claimed in claim 15 and applied to each of a plurality of current mirror circuits connected in cascade.

19. A method as claimed in claim 13 wherein the current mirror circuits comprise differential current mirror circuits having differential signal inputs and outputs.

20. A method as claimed in claim 14 wherein the current mirror circuits comprise differential current mirror circuits having differential signal inputs and outputs.

* * * * *